& Thornburg

United States Patent [19]

Morcom et al.

[11] Patent Number: 4,471,376

[45] Date of Patent: Sep. 11, 1984

[54] AMORPHOUS DEVICES AND INTERCONNECT SYSTEM AND METHOD OF FABRICATION

[75] Inventors: William R. Morcom, Melbourne Beach, Fla.; Glenn M. Friedman, San Diego, Calif.

[73] Assignee: Harris Corporation, Melbourne, Fla.

[21] Appl. No.: 224,931

[22] Filed: Jan. 14, 1981

[51] Int. Cl.³ .................. H01L 23/48; H01L 45/00
[52] U.S. Cl. .......................................... 357/71; 357/2; 357/67
[58] Field of Search ................................ 357/2, 67, 71

[56] References Cited

U.S. PATENT DOCUMENTS

| | | | |
|---|---|---|---|
| 3,409,809 | 11/1968 | Diehl | 357/71 |
| 3,675,090 | 7/1972 | Neale | 357/71 |
| 3,699,543 | 10/1972 | Neale | 357/2 |
| 3,946,426 | 3/1976 | Sanders | 357/71 |
| 4,151,545 | 4/1979 | Schnepf | 357/71 |

OTHER PUBLICATIONS

IBM Technical Disclosure Bulletin, vol. 15, No. 2, Jul. 1972, pp. 577–579.

Primary Examiner—Martin H. Edlow
Assistant Examiner—J. L. Badgett
Attorney, Agent, or Firm—Barnes & Thornburg

[57] ABSTRACT

An amorphous semiconductor device on a silicon substrate having a first level contact and interconnect of aluminum and coextensive layer of molybdenum and a second level contact and interconnect of molybdenum and coextensive layer of aluminum. Contacts to the amorphous device are by the two molybdenum layers and the contact of the second level contacts to the substrate is through the first level contacts.

The method of fabrication includes forming a first aluminum layer on and through contact openings in a first insulating layer and a first layer of molybdenum on the aluminum, coetching these layers to form first level contacts and interconnects forming a second layer of insulating material, forming a layer of amorphous semiconductor material through an opening in the second insulating layer; forming a second layer of molybdenum over the substrate and through contact openings in the second insulating layer and a second layer of aluminum on the second layer of molybdenum, and coetching the second layers of molybdenum and aluminum to form second level contacts and interconnects.

16 Claims, 4 Drawing Figures

AMORPHOUS DEVICES AND INTERCONNECT SYSTEM AND METHOD OF FABRICATION

BACKGROUND OF THE INVENTION

1. Field of the Invention

The present invention relates generally to amorphous semiconductor devices and more specifically to contacts and interconnects for amorphous semiconductor devices formed on silicon substrates.

2. Description of the Prior Art

One of the concerns in amorphous semiconductor devices, be they threshold or memory devices, has been the proper selection of the contact materials. It it well known that these materials must be carefully selected to avoid contamination of the amorphous semiconductor material. Although aluminum is a well known conductor used especially with silicon substrates because of its low resistance and high adherence to silicon, it is generally unsatisfactory as a contact to amorphous semiconductor layers since the aluminum migrates into the amorphous material when current flows from the aluminum into the amorphous material. The problem of aluminum migration is overcome by using refractory materials such as molybdenum to isolate the aluminum from the amorphous material.

Although molybdenum provides a good isolating medium layer between the aluminum and the semiconductor material, molybdenum does not make ohmic contact with the silicon substrates. Prior devices generally used a thin layer of palladium silicide between the molybdenum and the silicon substrate to provide an ohmic contact. Molybdenum interconnects between the contact areas of the systems have proved to be unsatisfactory since they have such high sheet resistance. The high resistance has prevented the use of amorphous semiconductor devices at high speeds.

Thus, there exists a need for a contact interconnect system for amorphous semiconductor devices on a silicon substrate having low resistance, providing good adherence to the silicon substrate, preventing migration of the contacts into the amorphous layer, and providing ohmic contact to the silicon substrate.

SUMMARY OF THE INVENTION

An object of the present invention is to provide a contact and interconnect system for amorphous semiconductor devices allowing an operating time of 25 to 100 nanoseconds.

Another object of the invention is to provide an interconnect system incorporating the use of aluminum and molybdenum interconnects and contact areas so as to accomplish relatively low resistance interconnects and prevent migration of the aluminum into the amorphous semiconductor material.

A further object of the invention is to provide an amorphous semiconductor device and interconnect system which prevents migration of aluminum interconnect and contact into the amorphous semiconductor layer while providing ohmic contacts to a silicon substrate.

Still a further object of the present invention is to provide a method of fabricating amorphous semiconductor devices on a silicon substrate having a low resistance interconnect system formed by a minimum of steps.

The present invention overcomes the problem of prior art contacts and interconnects of amorphous semiconductor devices built on silicon substrates by using a layer of aluminum and a coextensive layer of molybdenum as a first level contact and interconnect and a second layer of molybdenum and a coextensive layer of aluminum as a second level contact and interconnect. The first layer of aluminum contacts the substrate and is isolated from the amorphous device by the first layer of molybdenum. The layer of molybdenum and aluminum form discrete contact areas to the substrate and interconnects between discrete areas of the substrate over a first layer of insulating material. A second layer of molybdenum and aluminum forms a second level interconnect over a second layer of insulating material separating the first and second levels of interconnects and is connected to the substrate through the first level contacts of the first layer of aluminum and molybdenum. The coexistivity of the aluminum and molybdenum layers in the first and in the second level interconnect system reduces the resistivity of the total interconnect layer as compared to an all molybdenum layer, while allowing the molybdenum layer to isolate the aluminum from the amorphous material.

The method of fabricating the contact interconnects system of the present invention begins with forming apertures in a first layer of insulating material to expose contact areas to the silicon substrate. A first layer of aluminum is formed on the substrate and a layer of molybdenum is formed on the layer of aluminum. These two layers are then masked and coetched to form coextensive first level discrete contacts and interconnects between some of the discrete contacts. A second layer of insulating material is formed over the substrate and openings are formed therein to expose first level contacts. A layer of amorphous semiconductor material is formed over the second insulating layer and through the openings. The amorphous semiconductor material is masked and etched to form amorphous semiconductor elements on selected first level contacts. A second layer of molybdenum is formed over the substrate and a layer of aluminum if formed over the molybdenum layer. These two layers are then masked and coetched to form coextensive second level contacts and coextensive second level interconnects over the second layer of insulation to the first level contacts, and to the amorphous semiconductor material.

Other objects, advantages and novel features will become apparent from the following detailed description of the invention when considered in conjunction with the accompanying drawings.

DESCRIPTION OF THE PREFERRED EMBODIMENTS

Figure 1:
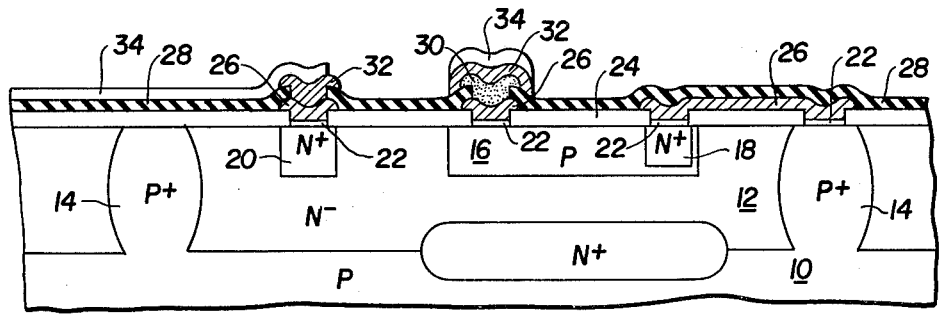
FIG. 1 is a cross-sectional view of an amorphous semiconductor device of the prior art.

An example of the prior art system using palladium silicide and molybdenum is illustrated in FIG. 1. The integrated circuit includes a substrate 10 having a collector region 12 formed between lateral isolation barriers 14. Base region 16 is formed in collector region 12 and an emitter region 18 is formed in base region 16. A high impurity collector contact region 20 is formed in collector 12. A flesh or thin layer of palladium silicide or platinum silicide 22 is formed on the contact areas to collector contact 20, base 16, emitter 18 and isolation barrier 14 through a first insulating layer 24. A first level contact and interconnect further includes a molybdenum layer 26 formed on the layers 22. The palladium silicide or platinum silicide allows the molybdenum 26 to form an ohmic contact with the silicon substrate. A second insulating layer 28 lies over the first insulating layer and first level contacts and interconnects. An amorphous semiconductor layer 30 is applied over the base contact. A second layer 32 of molybdenum is then applied over the substrate and a second layer 34 of aluminum is then formed over the molybdenum layer 32. The aluminum layer 34 is isolated from the amorphous semiconductor layer 30 by the molybdenum layer 32.

As illustrated in FIG. 1, the first molybdenum layer 26 forms an interconnect between the emitter 18 and the isolation barrier 14. The amorphous layer 30 is contacted on the bottom and top by molybdenum layers 26 and 32, respectively, wherein the top layer 32 isolates the aluminum interconnect 34 from the amorphous layer 30 and a palladium silicide platinum silicide layer 22 allows ohmic contact between the bottom electrode and the substrate. Collector contact region 20 includes an aluminum second level interconnect 34 connected to the substrate through two molybdenum layers 32 and 26 and a palladium silicide or platinum silicide layer 22. As discussed above, the use of molybdenum as an interconnect, as for example, the first level interconnect between the emitter 18 and the isolation barrier 14, provides a high resistance interconnect, and thus, increases the time required to switch the state or operate the amorphous semiconductor layer 30. The palladium silicide layer 22 is formed by applying palladium, sintering to form palladium silicide in the exposed contact area, and etching to remove the pure palladium. This formation is separate from the application and delineation of molybdenum layer 26 and increases the number of steps and consequently, the costs of the manufacturing.

Figure 2:
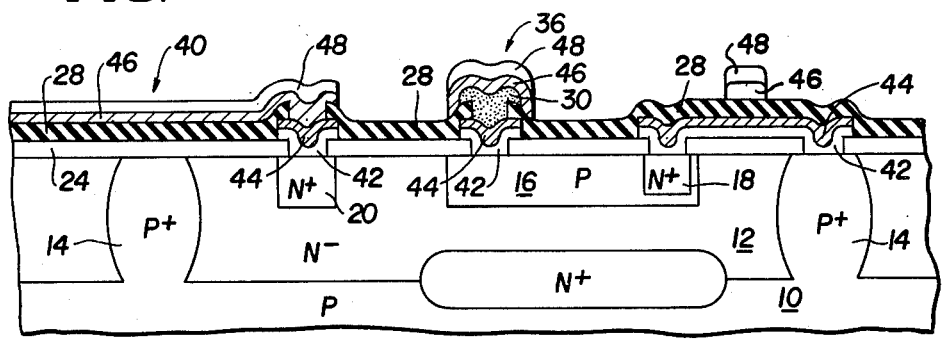
FIG. 2 is a cross-sectional view of an amorphous semiconductor device on a silicon substrate incorporating the principles of the present invention.

To illustrate the concept of the present invention, the integrated circuit and interconnect of FIG. 1 has been modified as illustrated in FIG. 2 and includes an amorphous semiconductor device 36, first level interconnect 38 and a second level interconnect 40. The amorphous device 36 has a bottom or first level contact including an aluminum layer 42 and a refractory conductive material layer 44, an amorphous semiconductor layer 30, and a top or second level contact including a refractory conductive material layer 46 and a coextensive low resistance conductive layer 48. First level interconnect 38 between emitter region 18 and isolation barrier 14 includes a first contact and interconnect layer of aluminum 42 contacting the substrate and traversing the first insulating layer 24 and a second coextensive layer 44 of a refractory conductive material. The second level interconnect 40 between collector contact 20 and another portion of the intergrated circuit has a first level contact including a layer of aluminum 42 and a coextensive layer of refractory material 44, and a second level contact and interconnect including a refractory conductive layer 46 traversing the second insulating layer 28, and a coextensive, low resistance conductive layer 48.

The simple transistor-amorphous device and interconnects are one of a plurality of transistor-amorphous device-interconnect combinations forming a memory array. Although the amorphous device is shown connected to the base, it may be connected to the emitter and used in an emitter follower array having a common collector for the array. The metallization of the present invention is applicable to these and other arrays.

Preferably, the first layer 42 is aluminum or silicon doped aluminum having a thickness of between 5000 to 8000 angstroms, the refractory conductive layers 44 and 46 are preferably molybdenum having a thickness in the range of 1000 to 2000 angstroms and 1000 to 2000 angstoms respectively, and the low resistance conductive layer 48 is preferably aluminum having a thickness in the range of 11,000 to 19,000 angstroms. Amorphous semiconductor layer 30 may be any of the known layers which include arsenic telluride and germanium telluride. Although molybdenum is the preferred refractory conductive material separating the aluminum layers 42 and 48 from the amorphous layer 30, other refractory materials may be used. Since the top layer 48 does not contact the semiconductor surface, any low resistance conductor may be used, for example, gold, titanium-platinum-gold-structure, or copper, instead of the suggested aluminum or silicon doped aluminum.

Structure of FIG. 2 solves the problems of the prior art by using low conductivity metal which has a good adherence to and makes ohmic contact with the silicon substrate, namely, aluminum or silicon doped aluminum, as a first level contact and interconnect while using refractory materials, such as molybdenum, to isolate the aluminum layers from the amorphous semiconductor layer to prevent migration of the aluminum into the amorphous material. By forming the first and second level interconnects of coextensive layers of refractory material and low resistivity conductive layers, the relatively high resistance of the refractory material is reduced by the low resistivity material since they are electrically in parallel. For example, an aluminum layer 42 of a thickness of 8000 angstroms and resistance of 0.055 ohms/square, and a molybdenum layer 44 of a thickness of 1500 angstroms and resistance of 1 ohms/square will produce a parallel combination of 0.052 ohms per square. Similarly, the second level interconnect having a molybdenum layer 46 of a thickness of 1500 angstroms and resistance of 1 ohms/square and an aluminum layer 48 of a thickness of 19,000 angstroms and resistance of 0.025 ohms/square will produce an interconnect 40 having an overall resistance of 0.024 ohms per square. Thus, the contact interconnect system of the present invention as illustrated in FIG. 2 provides ohmic contacts to the silicon substrate, prevents migration of aluminum into the amorphous semiconductor layer, and provides a contact and interconnect of sufficiently low resistance to allow operation of the integrated circuit within the range of 50 nanoseconds.

Figure 3:
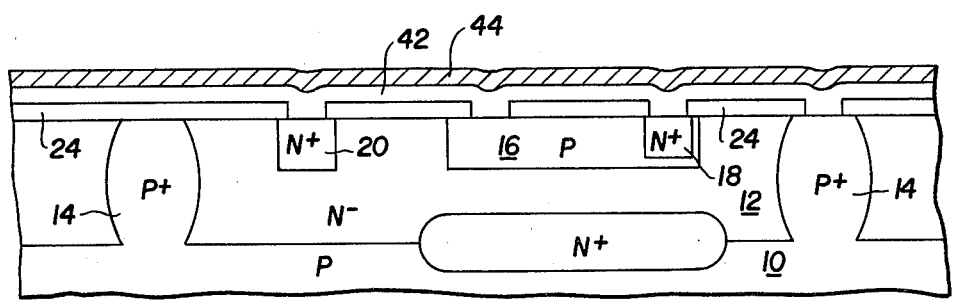
FIGS. 3 and 4 are cross-sectional views illustrating the fabrication steps according to the principles of the present invention to fabricate the device of FIG. 2.
Figure 4:
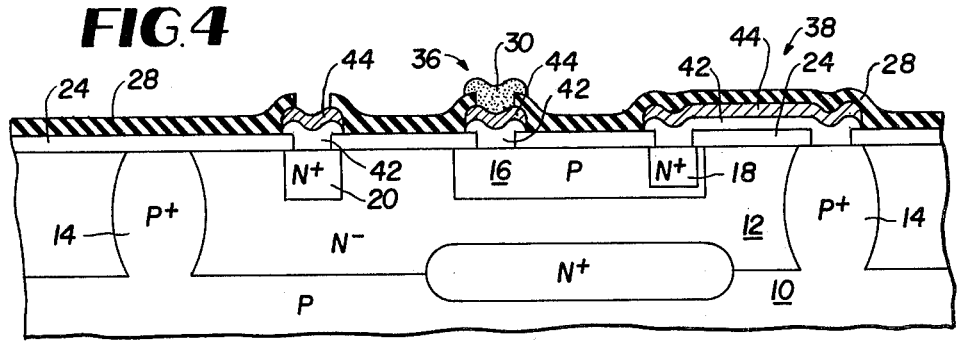

The process or method of fabricating the integrated circuit of FIG. 2 is illustrated in FIGS. 3 and 4. After the standard fabrication technique to produce the integrated circuit contact openings are provided in the thermally-grown oxide layer 24 exposing contact areas to collector contact 20, base region 16, emitter 18, and an isolation barrier 14. The silicon wafer is then cleaned and placed in a vacuum evaporation apparatus. A layer of aluminum 42 of a thickness of approximately 8000 angstroms is deposited on the wafer by vacuum evaporation. Next, a molybdenum layer 44 of approximately 1000 angstroms is deposited on the aluminum layer 42 by vacuum evaporation. Although using vacuum evaporation techniques, the conductive layers may be applied by deposit or other techniques, for example, electron beam vacuum evaporation or sputtering. The wafer at this stage of fabrication is illustrated in FIG. 3.

A layer of photoresist is then formed on the molybdenum layer 44 and exposed to define the first level contacts for amorphous device 36 and second level interconnect 40, and contacts and interconnect for first level interconnects 38. The photoresist is developed and a suitable etchant is used to remove exposed portions of the molybdenum and aluminum layers. An etchant such as phosphoric acid will coetch both layers. A second insulating layer 28 is formed by, for example, chemical vapor deposition. Openings are formed in the insulating layer 28 to expose the first level contact of the amorphous semiconductor device 36 and first level contacts to which the second level contacts are made. This would, for example, be to expose first level contact layers 42 and 44 for the collector contact 20. A layer of amorphous semiconductor material 30 is then applied over the substrate and delineated by masking to form a layer 30 on the molybdenum layer 44 at the base 16 only with the collector first level contact exposed. The layer 30 also extends over the contiguous portion of the insulating layer 28. The wafer at this stage of fabrication is illustrated in FIG. 4.

Alternatively, openings in insulating layer 28 may be limited initially to the first level contact of the amorphous semiconductor device 36. The layer of amorphous semiconductor material is then applied and delineated and followed by forming openings in the insulating layer 28 to expose first level contacts for example for collector region 20.

Next, a layer of molybdenum 46 is applied over the substrate, and a layer of aluminum 48 is applied over the molybdenum layer 46. The molybdenum layer 46 and aluminum layer 48 are then masked by a photoresist layer as described above and coetched to form the second layer contacts and interconnect. This would also include the top contact for the amorphous semiconductor 36 and the contact and interconnect 40.

To prevent migration of the lower aluminum level 42 into the substrate, silicon doped aluminum is preferably used. The vacuum depositions of the conductive layers are carried out below 300 degrees centigrade so as not to degrade the aluminum-silicon interfaces. Although a specific integrated circuit is shown having specific contacts and interconnects, other contacts and interconnects may be formed. The essence of the circuit being that the first level interconnects include coextensive layers of aluminum and refractory material coetched and that the second level interconnects are separated from the first level interconnects and include coextensive layers of refractory material and a low resistance conductive material. Coetching assures a low resistance parallel combination of the two conductive layers and reduces the number of process steps. The use of first layer aluminum provides good adherence and ohmic contact to the silicon semiconductor substrate. The refractory material provides the needed isolation between the aluminum and the amorphous semiconductor layer.

In the preceding description of the preferred embodiment, it is evident that the objects of the invention have been attained in that low resistance ohmic contacts and interconnects are formed for an amorphous semiconductor device built on a silicon substrate which is capable of operating in the range of 25 to 100 nanoseconds. Although the invention has been described and illustrated in detail, it is to be understood that the same is by way of illustration and example only and is not to be taken by way of limitation. The spirit and scope of the invention is to be limited only by the terms of the appended claims.

What is claimed:

1. An integrated circuit comprised of an amorphous device on a silicon substrate, further comprising:
    a first layer of aluminum contacting said substrate and a second layer of refractory conductive material lying on and being coextensive with said first layer, said first and second layers being patterned to form a bottom contact for said amorphous device and a first level conductor interconnect between two regions in said substrate; and
    a third layer of refractory conductive material with a fourth layer of low resistance conductor material lying on and being coextensive with said third layer, said third and fourth layers being patterned to form, in combination, an upper contact for said amorphous device and a second level conductor interconnect between said amorphous device and said substrate, wherein said second level conductor interconnect is placed in contact with said substrate by a portion of said first and second layers directly beneath a portion of said third layer not forming said upper contact.

2. The integrated circuit according to claim 1 wherein said first layer is separated from said substrate by a fifth layer of insulating material except at contact areas with said substrate and said third layer is separated from said second layer except at said portions of said second layer placing said second conductors in contact with said substrate and from said substrate by a sixth layer of insulating material.

3. The integrated circuit according to claim 1 wherein said second and third layers are molybdenum.

4. The integrated circuit according to claim 1 wherein said first and fourth layers are silicon doped aluminum.

5. The integrated circuit according to claim 1 wherein said first layer is separated from said substrate except at contact areas to said substrate by a layer of insulating material and said third layer is separated from said second layer and said substrate except at contact areas by a layer of insulating material.

6. The integrated circuit according to claim 1 wherein said first layer is between 5000 to 8000 angstroms in thickness and said second layer is between 1000 to 2000 angstroms in thickness.

7. The integrated circuit according to claim 7 wherein said third layer is between 1000 to 2000 angstroms in thickness and said fourth layer is between 11,000 to 19,000 angstroms in thickness.

8. An integrated memory array comprising:
    a silicon substrate;
    a plurality of active devices in said substrate;
    a plurality of amorphous semiconductor storage devices on said substrate each having a first layer of aluminum contacting a respective active device in said substrate, a second layer of refractory conductive material superimposed on said first layer, a third layer of amorphous semiconductor material superimposed on said second layer, a fourth layer of refractory conductive material a portion of which is superimposed on said third layer and a fifth layer of aluminum superimposed and coextensive with said fourth layer;

a plurality of first conductor means for connecting said fourth and fifth layers to said substrate through openings in a first and second insulating layer on said substrate, each of first conductor means including an aluminum contact layer of the same material as said first layer superimposed on said substrate through an opening and a refractory conductive material contact layer of the same material as said second layer superimposed on and coextensive with said aluminum contact layer wherein a portion of said fourth layer and superimposed fifth layer not superimposed on said amorphous semiconductor material traverse said second insulating layer to have a portion superimposed on said refractory conductive material contact layer; and a plurality of second conductor means each for interconnecting at least two areas of said substrate through openings in said first insulating layer, each second conductor means include a layer of aluminum contacting said substrate through said openings and a superimposed coextensive layer of said refractory conductive material, wherein said first insulating layer separates said aluminum layer of said second conductor means from said substrate except at said openings and said second insulating layer separates said refractory conductive layer of said second conductor means from said portion of said fourth layer not superimposed on said amorphous semiconductor material except at said contact openings.

9. The integrated memory array according to claim 8 wherein said refractory conductive material is molybdenum.

10. The integrated memory array according to claim 8 wherein said first layer, said first conductor means' aluminum contact layer, and said second conductor means' aluminum layer are silicon doped aluminum.

11. The integrated circuit according to claim 1 wherein said first layer and said second conductor means' aluminum contact layers are between 5000 an 8000 angstroms thick and said second layer and said refractory contact layer are between 1000 and 2000 angstroms thick.

12. The memory array of claim 8, wherein said aluminum contact and refractory conductive material are codeposited with said first and second layers.

13. An interconnect system for amorphous semiconductor devices on a silicon substrate comprising:

a first and a second layer of insulating material on said substrate having openings exposing contact areas on said substrate;

a first layer of aluminum on all of said contact areas and portions of said first insulating layer;

a second layer of refractory conductive material superimposed and coextensive with said first layer;

said first and second layers being patterned to form in combination at least first, second, third and fourth discrete contacts and a first level interconnect between said third and fourth contacts and separated from said substrate by said first insulating layer;

a third layer of amorphous semiconductor material superimposed on said second layer of said first contact;

a fourth layer of refractory conductive material, a portion of which is superimposed on said third layer, a portion of which is superimposed on said second layer of said second contact and a portion of which is superimposed and separated from said second layer except at said second contact by said second insulating layer;

a fifth layer of low resistance conductive material superimposed on and coextensive with said fourth layer;

said fourth and fifth layer being patterned to form in combination contacts and second level interconnects between said first contact and said third layer.

14. The interconnect system according to claim 13 wherein said first layer of insulating material is a thermally grown silicon oxide and said second insulating layer is a chemically vapor-deposited insulating layer.

15. The interconnect system according to claim 13 wherein said refractory material is molybdenum, said first layer is silicon doped aluminum, and said fifth layer is aluminum.

16. The interconnect system according to claim 13 wherein said first layer is between 5000 to 8000 angstroms thick, said second layer and fourth layers are between 1000 to 2000 angstroms thick and said fifth layer is between 11,000 to 19,000 angstroms thick.

* * * * *